US010724152B2

(12) United States Patent
Shonai et al.

(10) Patent No.: US 10,724,152 B2
(45) Date of Patent: Jul. 28, 2020

(54) METHOD FOR PRODUCING SIC SINGLE CRYSTAL, SIC SINGLE CRYSTAL, AND SIC INGOT

(71) Applicant: SHOWA DENKO K.K., Tokyo (JP)

(72) Inventors: Tomohiro Shonai, Hikone (JP); Masakazu Kobayashi, Hikone (JP); Masanori Yamada, Kariya (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 15/779,225

(22) PCT Filed: Nov. 29, 2016

(86) PCT No.: PCT/JP2016/085357
§ 371 (c)(1),
(2) Date: May 25, 2018

(87) PCT Pub. No.: WO2017/094707
PCT Pub. Date: Jun. 8, 2017

(65) Prior Publication Data
US 2018/0355511 A1 Dec. 13, 2018

(30) Foreign Application Priority Data

Dec. 3, 2015 (JP) .................................. 2015-236774

(51) Int. Cl.
*C30B 29/36* (2006.01)
*C30B 23/02* (2006.01)
(Continued)

(52) U.S. Cl.
CPC ............ *C30B 29/36* (2013.01); *C01B 32/956* (2017.08); *C30B 23/02* (2013.01); *C30B 23/025* (2013.01);
(Continued)

(58) Field of Classification Search
None
See application file for complete search history.

(56) References Cited

U.S. PATENT DOCUMENTS

2003/0070611 A1  4/2003  Nakamura et al.
2005/0211156 A1  9/2005  Gunjishima et al.
(Continued)

FOREIGN PATENT DOCUMENTS

JP  2003-119097 A  4/2003
JP  2004-323348 A  11/2004
(Continued)

OTHER PUBLICATIONS

International Search Report for PCT/JP2016/085357 dated Dec. 27, 2016 (PCT/ISA/210).

*Primary Examiner* — Guinever S Gregorio
(74) *Attorney, Agent, or Firm* — Sughrue Mion, PLLC (57) ABSTRACT

This method for producing a SiC single crystal includes a first growth step of growing a crystal from a seed crystal in a direction that is substantially orthogonal to the <0001> direction, a second growth step of growing the crystal in a direction that is substantially orthogonal to the <0001> direction and substantially orthogonal to the direction of crystal growth in the first growth step, a third growth step of growing the crystal along the direction of crystal growth in the first growth step but in the opposite orientation to the orientation of crystal growth in the first growth step, and a fourth growth step of growing the crystal along the direction of crystal growth in the second growth step but in the opposite orientation to the orientation of crystal growth in the second growth step.

8 Claims, 3 Drawing Sheets

(51) Int. Cl.
   *C01B 32/956* (2017.01)
   *H01L 29/16* (2006.01)
   *H01L 21/02* (2006.01)

(52) U.S. Cl.
   CPC ...... *H01L 29/1608* (2013.01); *C01P 2002/78* (2013.01); *H01L 21/02378* (2013.01); *H01L 21/02433* (2013.01); *H01L 21/02529* (2013.01); *H01L 21/02609* (2013.01); *H01L 21/02631* (2013.01)

(56) References Cited

U.S. PATENT DOCUMENTS

2014/0091325 A1   4/2014   Gunjishima et al.
2016/0230309 A1*  8/2016   Danno .................... C30B 19/12

FOREIGN PATENT DOCUMENTS

| JP | 2005-179155 A | 7/2005 |
| JP | 2012-250888 A | 12/2012 |
| JP | 2014-201466 A | 10/2014 |

\* cited by examiner

FIG. 6

METHOD FOR PRODUCING SIC SINGLE CRYSTAL, SIC SINGLE CRYSTAL, AND SIC INGOT

CROSS REFERENCE TO RELATED APPLICATIONS

This application is a National Stage of International Application No. PCT/JP2016/085357 filed Nov. 29, 2016, claiming priority based on Japanese Patent Application No. 2015-236774, filed Dec. 3, 2015.

TECHNICAL FIELD

The present invention relates to a method for producing a SiC single crystal, a SiC single crystal, and a SiC ingot. Priority is claimed on Japanese Patent Application No. 2015-236774, filed Dec. 3, 2015, the content of which is incorporated herein by reference.

BACKGROUND ART

Silicon carbide (SiC) has a dielectric breakdown electric field that is an order of magnitude larger than that of silicon (Si), and a band gap that is three times as wide. Further, silicon carbide (SiC) has thermal conductivity that is about three times higher than that of silicon (Si). Silicon carbide has these types of characteristic properties. As a result, silicon carbide (SiC) holds much promise for applications to power devices, high-frequency devices, and high-temperature operation devices and the like.

In recent years, in order to obtain many semiconductor devices from a single substrate, increases in the diameter of SiC single crystal substrates have been sought. Accordingly, demand for SiC single crystals of larger diameter is also growing.

SiC single crystal substrates are produced by cutting a SiC ingot. These SiC ingots are generally obtained by the sublimation method. The sublimation method is a method in which a seed crystal composed of a SiC single crystal is placed on a pedestal located inside a graphite crucible, and by heating the crucible, a sublimed gas produced by sublimation of a raw material powder provided inside the crucible is supplied to the seed crystal, thereby growing the seed crystal into a larger SiC ingot.

However, obtaining a large SiC ingot directly from a small seed crystal is difficult. As a result, the seed crystal is generally grown into a large SiC single crystal, with that SiC single crystal then being used to produce the SiC ingot.

It is common knowledge in the field of SiC single crystals that when growing a large SiC single crystal from a small seed crystal, the large SiC single crystal cannot be obtained in a single growth step. Accordingly, crystal growth from the seed crystal is performed over a plurality of crystal growth repetitions to obtain a large SiC single crystal.

Figure 1:
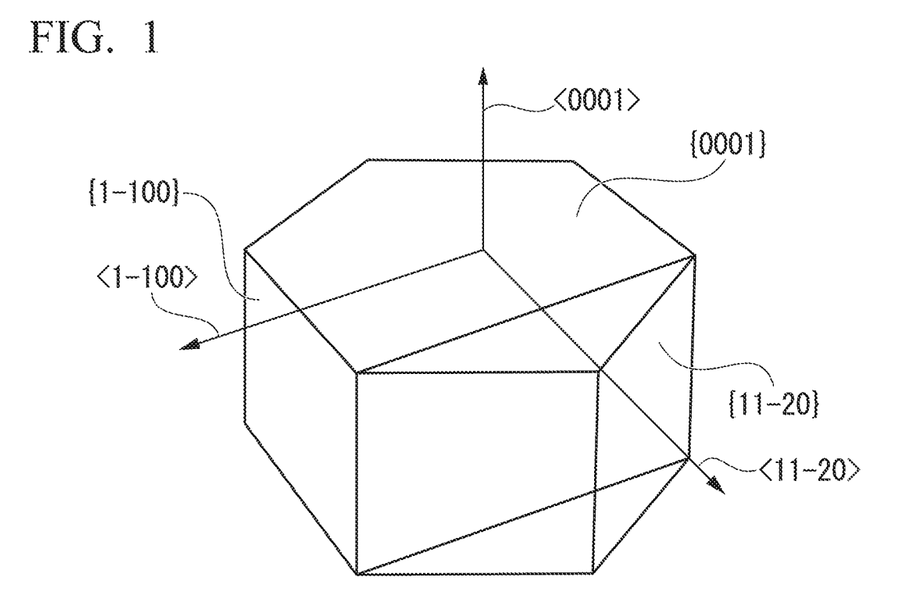
FIG. 1 is schematic illustration for describing crystal orientations and crystal planes.

During each crystal growth repetition, the crystal growth direction of the growing crystal is important. FIG. 1 is a schematic illustration for describing crystal orientations and crystal planes. In SiC single crystals, the main known crystal planes are the {0001} plane (c-plane), and the 1-1001 plane (m plane) and {11-20} plane (a-plane) which are perpendicular to the c-plane. The "-" symbol in the crystal plane indices is typically included above the corresponding number, but in this description and in the drawings, for the sake of convenience, the symbol is included to the left of the number. Further, in the case of <0001>, <1-100> and <11-20> which indicate crystal orientations, the symbol "-" is used in the same manner. In the following description, crystal growth in the <0001> direction is also referred to as "c-plane growth", crystal growth in the <1-100> direction is also referred to as "m-plane growth", and crystal growth in the <11-20> direction is also referred to as "a-plane growth".

The brackets { } which show the indices that indicate the plane, and the brackets < > which show the indices that indicate direction show planes and directions having equivalent symmetry, and therefore do not differentiate orientation. In the present description, when differentiating planes or directions, differentiation is sometimes made on the basis of "orientation". For example, when one surface of a crystal having {11-20} planes on both the front and back surfaces is deemed the front surface, the back surface may sometimes be referred to as "the surface of opposite orientation".

When a crystal is grown in the c-plane direction from a seed crystal, a known problem occurs in that the single crystal obtained following growth contains an extremely large number of defects such as micropipe defects and threading screw dislocations in directions parallel to the <0001> direction.

As a result, one known method that is used for obtaining a large SiC single crystal from a small seed crystal is the RAF (Repeated a-face) method disclosed in Patent Documents 1 and 2. The RAF method is a method in which a-plane growth is performed at least once, and then c-plane growth is performed. By using the RAF method, a SiC single crystal having almost no screw dislocations or stacking faults can be produced. This is because any screw dislocations or stacking faults within the SiC single crystal following the a-plane growth are not inherited in the SiC single crystal obtained following c-plane growth. A SiC single crystal obtained following a-plane growth has stacking faults formed parallel to the <11-20> direction. However, in c-plane growth, crystal growth occurs in a direction perpendicular to the direction in which these stacking faults have been formed. Consequently, a SiC single crystal obtained by performing c-plane growth after a-plane growth has almost no screw dislocations or stacking faults.

Furthermore, Patent Document 3 discloses a method for producing a SiC ingot in which, in order to further suppress screw dislocations and stacking faults, a grown SiC single crystal is cut at a prescribed angle, and the SiC ingot is then produced based on this cut SiC single crystal.

PRIOR ART LITERATURE

Patent Documents

Patent Document 1: Japanese Unexamined Patent Application, First Publication No. 2004-323348
Patent Document 2: Japanese Unexamined Patent Application, First Publication No. 2005-179155
Patent Document 3: Japanese Unexamined Patent Application, First Publication No. 2012-250888

SUMMARY OF THE INVENTION

Problems to be Solved by the Invention

However, in the methods described above, obtaining a SiC single crystal that is compatible with SiC single crystal wafers of increased size has proven difficult.

More specifically, in the stage of obtaining a large SiC single crystal from a small seed crystal, cracking of the SiC single crystal has proven to be problematic. For example, this problem is particularly serious when attempting to obtain a SiC single crystal that enables production of recent 6-inch SiC single crystal wafers.

The present invention has been developed in light of the above problems, and has an object of providing a method for producing a SiC single crystal that is capable of producing a SiC single crystal that is compatible with SiC single crystal wafers of increased size. Further, the invention also has the objects of providing a SiC single crystal, a SiC ingot and a SiC single crystal wafer that are produced using the above method for producing a SiC single crystal.

Means for Solving the Problems

As a result of intensive investigation, the inventors of the present invention noticed that this problem of the SiC single crystal cracking during the growth process is caused by strain accumulated in the crystal growth direction. Accordingly, they discovered that when growing a SiC single crystal from a seed crystal, by controlling the direction in which the crystal undergoes crystal growth, cracking of the SiC single crystal both during crystal growth and following crystal growth could be suppressed. As a result, the inventors found they could produce SiC single crystals compatible with SiC single crystal wafers of increased size, enabling them to complete the present invention.

In other words, in order to achieve the objects described above, the present invention provides the following aspects.

(1) A method for producing a SiC single crystal according to one aspect of the present invention includes a first growth step of growing a crystal from a seed crystal in a direction that is substantially orthogonal to the <0001> direction, a second growth step of growing the crystal in a direction that is substantially orthogonal to the <0001> direction and substantially orthogonal to the direction of crystal growth in the first growth step, a third growth step of growing the crystal along the direction of crystal growth in the first growth step but in the opposite orientation to the orientation of crystal growth in the first growth step, and a fourth growth step of growing the crystal along the direction of crystal growth in the second growth step but in the opposite orientation to the orientation of crystal growth in the second growth step.

(2) A method for producing a SiC single crystal according to one aspect of the present invention includes a first growth step of growing a crystal from a seed crystal in the <1-100> direction or the <11-20> direction, a second growth step of growing the crystal in the direction among the <1-100> direction and the <11-20> direction in which crystal growth was not performed in the first growth step, a third growth step of growing the crystal along the direction of crystal growth in the first growth step but in the opposite orientation to the orientation of crystal growth in the first growth step, and a fourth growth step of growing the crystal along the direction of crystal growth in the second growth step but in the opposite orientation to the orientation of crystal growth in the second growth step.

(3) In the method for producing a SiC single crystal according to (1) or (2) above, each of the first growth step, the second growth step, the third growth step and the fourth growth step may be divided into a plurality of stages.

(4) In the method for producing a SiC single crystal according to any one of (1) to (3) above, the first growth step, the second growth step, the third growth step and the fourth growth step may represent one set, and the set may be performed at least once.

(5) In the set of growth steps in the method for producing a SiC single crystal according to (4) above, the growth steps may be performed in a sequence composed of the first growth step, the second growth step, the third growth step, and then the fourth growth step.

(6) In the set of growth steps in the method for producing a SiC single crystal according to (4) above, the growth steps may be performed in a sequence composed of the first growth step, the third growth step, the second growth step, and then the fourth growth step.

(7) In the method for producing a SiC single crystal according to any one of (1) to (6) above, the amount of growth of the single crystal in the third growth step relative to the amount of growth of the single crystal in the first growth step may be within a range from 0.9 times to 1.1 times.

(8) In the method for producing a SiC single crystal according to any one of (1) to (7) above, the amount of growth of the single crystal in the fourth growth step relative to the amount of growth of the single crystal in the second growth step may be within a range from 0.9 times to 1.1 times.

(9) In the method for producing a SiC single crystal according to any one of (1) to (8) above, the length of crystal growth from the seed crystal in each orientation may be from 0.5 times to 5 times the thickness of the seed crystal.

(10) In the method for producing a SiC single crystal according to any one of (1) to (9) above, in each of the first growth step, the second growth step, the third growth step and the fourth growth step, the SiC single crystal obtained following each growth step has a length along the long direction that is not more than 10 times the length along the short direction.

(11) A SiC single crystal according to one aspect of the present invention includes a seed crystal, a first growth portion formed in a direction that is substantially orthogonal to the <0001> direction, a second growth portion formed in a direction that is substantially orthogonal to the <0001> direction and substantially orthogonal to the direction in which the first growth portion is formed, a third growth portion that is formed on the surface of the seed crystal opposite the first growth portion, and a fourth growth portion that is formed on the surface of the seed crystal opposite the second growth portion.

(12) A SiC ingot according to one aspect of the present invention contains a SiC single crystal according to (11) above, and a c-axis growth portion formed on the {0001} plane of the SiC single crystal.

In this description, a "direction that is substantially orthogonal to the <0001> direction" is a direction in which, during c-plane growth, crystal growth can be performed without inheriting screw dislocations or stacking faults within the growing crystal. More specifically, the direction is preferably a direction that has an angle of 90°±10°, and more preferably an angle of 90°±5°, relative to the <0001> direction.

Further, in this description, a "direction that is substantially orthogonal to the <0001> direction and substantially orthogonal to the direction of crystal growth in the first growth step" is a "direction that is substantially orthogonal to the <0001> direction" that is also a direction having an angle of 90°±10°, and more preferably an angle of 90°±5°, relative to the direction of growth in the first growth step. By performing crystal growth in this direction in the second growth step, it is possible to obtain a SiC single crystal with few screw dislocations having large area c plane and few stacking faults.

Effects of the Invention

The method for producing a SiC single crystal according to one aspect of the present invention includes a first growth step, a second growth step, a third growth step and a fourth growth step. The crystal growth direction in the third growth step is opposite the orientation of crystal growth in the first growth step with respect to the seed crystal. The crystal growth direction in the fourth growth step is opposite the orientation of crystal growth in the second growth step with respect to the seed crystal. Each of the growth steps may also be divided into a plurality of stages.

Strain in SiC single crystals occurs as a result of stress that develops in the crystal growth direction of the SiC single crystal.

By altering the orientation in which stress occurs in each step, the amount of stress acting on the SiC single crystal can be reduced. Further, by ensuring that the orientations of crystal growth in the first and third growth steps, and in the second and fourth growth steps, are mutually opposite with respect to the seed crystal, crystal growth can be performed while alleviating any stress that develops. Furthermore, by repeating the first through fourth steps a plurality of times, a larger SiC single crystal can be obtained without cracking of the SiC single crystal due to stress. Moreover, by altering the orientation of crystal growth between the first growth step and the third growth step, and between the second growth step and the fourth growth step, a large SiC single crystal having few defects can be obtained.

In the method for producing a SiC single crystal according to one aspect of the present invention, the sequence in which the growth steps are performed is preferably one of the two sequences described below.

Sequence 1: first growth step, second growth step, third growth step, fourth growth step Sequence 2: first growth step, third growth step, second growth step, fourth growth step Both of these sequences have steps in which crystal growth is performed in orientations that alleviate the stress that develops during crystal growth. As a result, cracking of the SiC single crystal due to stress can be suppressed. In other words, a larger SiC single crystal can be obtained. Among the two sequences, the sequence 1 is preferred, as the ratio between the long side and the short side of the SiC single crystal obtained during the crystal growth process is less likely to become too large. If the ratio between the long side and the short side does not become too large, then cracking of the SiC single crystal can be better suppressed.

In the method for producing a SiC single crystal according to one aspect of the present invention, the amount of growth of the single crystal in the fourth growth step relative to the amount of growth of the single crystal in the second growth step is preferably within a range from 0.9 times to 1.1 times. Further, in the method for producing a SiC single crystal according to one aspect of the present invention, the amount of growth of the single crystal in the third growth step relative to the amount of growth of the single crystal in the first growth step is preferably within a range from 0.9 times to 1.1 times.

In the first and third growth steps, and in the second and fourth growth steps, the directions of crystal growth are opposite with respect to the seed crystal. In other words, the steps exist in a relationship wherein the stress generated during each growth step is canceled out by the stress that occurs when growth is performed in the opposite direction. Consequently, provided the amounts of growth in the single crystal during the first growth step and the third growth step or the amounts of growth in the single crystal during the second growth step and the fourth growth step are substantially equal, the stresses generated in the steps can effectively cancel each other out.

In the method for producing a SiC single crystal according to one aspect of the present invention, the length of the crystal growth in each step among the first growth step through fourth growth step is preferably within a range from 0.5 times to 5 times the thickness of the seed crystal. Further, the SiC single crystal obtained following each growth step preferably has a length along the long direction that is not more than 10 times the length along the short direction.

By ensuring that the length of crystal grown in each step satisfies the above range, the SiC single crystal obtained following crystal growth can be prevented from becoming excessively long in one direction. In other words, the moment acting on the SiC single crystal can be reduced, and cracking of the SiC single crystal can be better suppressed.

The SiC single crystal, the SiC ingot and the SiC single crystal wafer according to aspects of the present invention are obtained using the method for producing a SiC single crystal described above. Accordingly, the SiC single crystal, the SiC ingot and the SiC single crystal wafer according to aspects of the present invention are resistant to cracking and can be increased in size.

EMBODIMENTS FOR CARRYING OUT THE INVENTION

A method for producing a SiC single crystal, a SiC single crystal, a SiC ingot and a SiC single crystal wafer according to the present invention are described below in detail with appropriate reference to the drawings.

The drawings used in the following description may be drawn with specific portions enlarged as appropriate to facilitate comprehension of the features of the present invention, and the dimensional ratios and the like between the constituent elements may differ from the actual values. Further, the materials and dimensions and the like presented in the following examples are merely examples, which in no way limit the present invention, and may be altered as appropriate within the scope of the present invention.

(Method for Producing SiC Single Crystal)

First Embodiment

Figure 2:
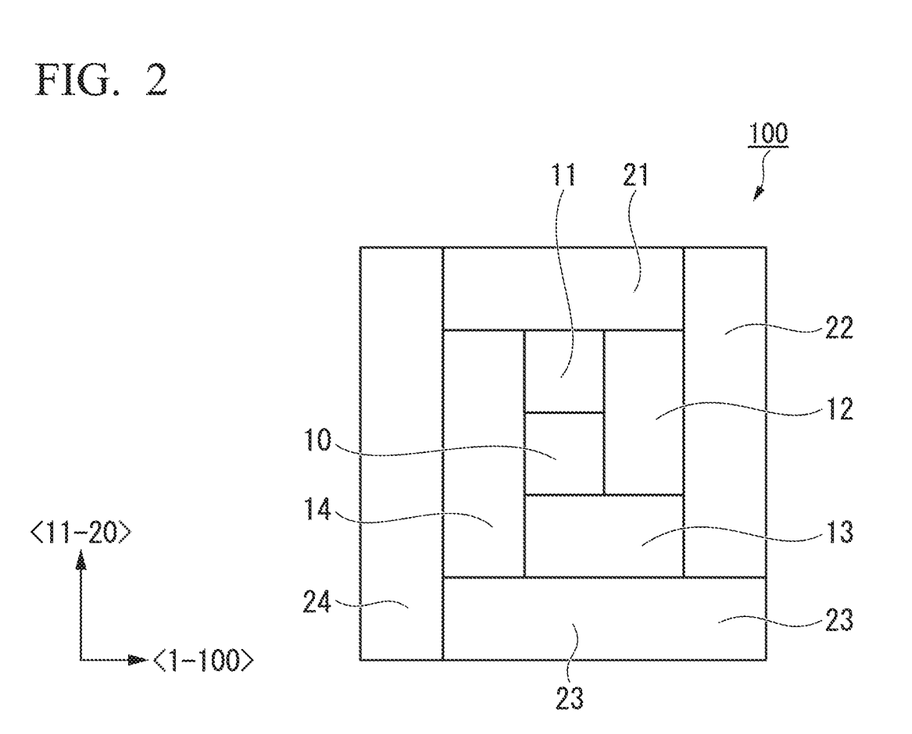
FIG. 2 is a schematic plan view for describing the production steps of a method for producing a SiC single crystal of a first embodiment.
Figure 3:
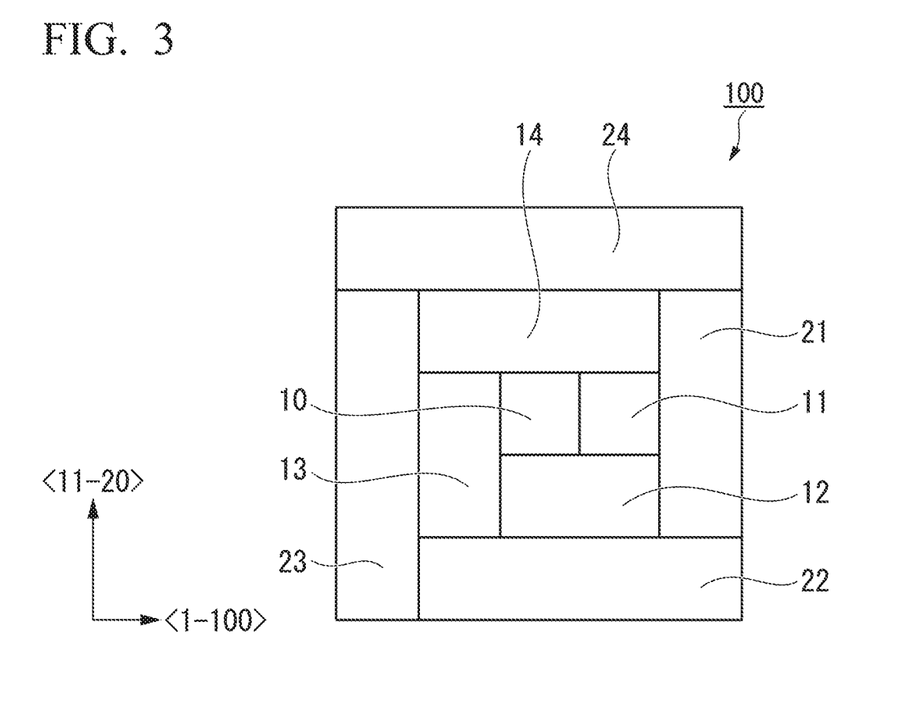
FIG. 3 is a schematic plan view for describing another example of the method for producing a SiC single crystal of the first embodiment.

FIG. 2 and FIG. 3 are schematic plan views for describing the production steps of a method for producing a SiC single crystal of a first embodiment. FIG. 2 and FIG. 3 are schematic plan views of the SiC single crystal viewed from the c-plane side of the SiC single crystal. The method for producing a SiC single crystal according to this first embodiment includes first through fourth growth steps. These growth steps are performed in a sequence composed of the first growth step, the second growth step, the third growth step, and then the fourth growth step, with this sequence representing one growth set, and this growth set is repeated a plurality of times. Each step is described in detail based on FIG. 2 and FIG. 3.

<First Growth Step>

The first growth step is a step in which the SiC single crystal is grown from a seed crystal 10 in either the <1-100> direction or the <11-20> direction. In FIG. 2 and FIG. 3, a first growth portion 11 is the portion formed by crystal growth in the first growth step. FIG. 2 illustrates an example in which crystal growth of the SiC single crystal has occurred in the <11-20> direction in the first growth step, whereas FIG. 3 illustrates an example in which crystal growth of the SiC single crystal has occurred in the <1-100> direction in the first growth step. The crystal growth direction in the first growth step may be either the <1-100> direction or the <11-20> direction of the seed crystal 10.

Figure 4:
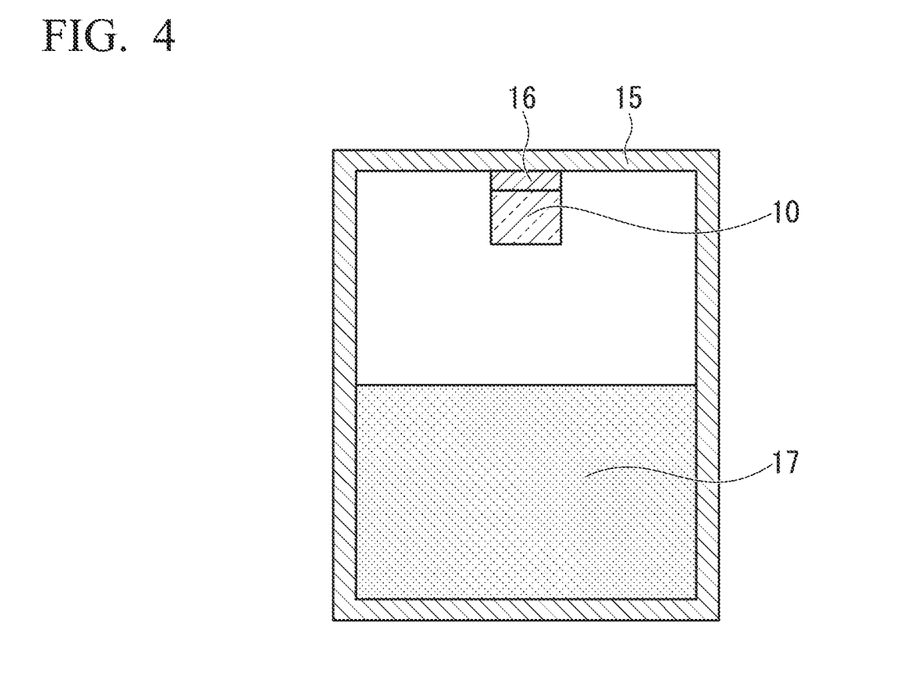
FIG. 4 is a schematic cross-sectional view for describing the sublimation method.

A conventional method may be used as the method for growing the first growth portion 11 on the seed crystal 10. For example, the first growth portion 11 can be obtained using the sublimation method. FIG. 4 is a schematic cross-sectional view for describing the sublimation method.

In the sublimation method, the seed crystal 10 is mounted on a seed crystal mount 16 provided facing a SiC raw material 17 inside a crucible 15. When the SiC raw material 17 is heated using a heater or the like provided outside the crucible 15, the SiC raw material 17 sublimes. This sublimed gas undergoes crystal growth on the seed crystal 10, yielding the first growth portion 11.

In this case, the surface of the seed crystal 10 facing the SiC raw material is the crystal growth surface. In other words, in those cases where the first growth portion 11 is formed in the <11-20> direction as illustrated in FIG. 2, the surface of the seed crystal 10 facing the SiC raw material is the a-plane, whereas in those cases where the first growth portion 11 is formed in the <1-100> direction as illustrated in FIG. 3, the surface of the seed crystal 10 facing the SiC raw material is the m-plane.

In the seed crystal 10, the surface opposite the surface on which crystal growth occurs (namely, the surface that contacts the seed crystal mount 16) is preferably planarized. Ensuring that the surface that is mounted to the seed crystal mount 16 is uniform enables the crystal growth surface (the a-plane or m-plane) to uniformly face the SiC raw material 17. As a result, the crystal growth speed is uniform, and a SiC single crystal of uniform quality can be obtained.

<Second Growth Step>

In the second growth step, crystal growth is performed in the direction among the <1-100> direction and the <11-20> direction in which crystal growth was not performed in the first growth step. In FIG. 2 and FIG. 3, a second growth portion 12 is the portion formed by crystal growth in the second growth step. In FIG. 2, because crystal growth of the SiC single crystal was performed in the <11-20> direction in the first growth step, the direction of crystal growth of the single crystal in the second growth step becomes the <1-100> direction. In contrast, in FIG. 3, because crystal growth of the SiC single crystal was performed in the <1-100> direction in the first growth step, the direction of crystal growth of the single crystal in the second growth step becomes the <11-20> direction.

The second growth step can be performed using the same method as the first growth step. During this step, the seed crystal 10 having the first growth portion 11 is mounted on the seed crystal mount 16. In a similar manner to the first growth step, the installation surface on the seed crystal mount 16 is the surface opposite the crystal growth surface, and is preferably planarized.

The direction in which crystal growth of the single crystal occurs in the second growth step is inclined by 90° relative to the direction of crystal growth of the single crystal in the first growth step. This yields two advantageous effects.

First is a description of the first effect. When crystal growth of a SiC single crystal occurs, stress is generated in the direction of that crystal growth. In other words, if crystal growth is performed in only one direction, then stress accumulates in that crystal direction. That accumulated stress can become the cause of SiC single crystal damage following crystal growth.

This problem is particularly marked when producing large SiC single crystals.

By inclining the direction of crystal growth of the single crystal in the second growth step at an angle of 90° relative to the direction of crystal growth of the single crystal in the first growth step, the direction in which stress acts in the first growth step and the direction in which stress acts in the second growth step are mutually inclined by 90°. As a result, the vectors along which the stresses act differ, meaning that compared with the case where crystal growth is performed in a single direction, the stress acting on the SiC single crystal can be alleviated.

Next is a description of the other effect. The first growth portion 11 obtained following the first growth step has internal defects caused by screw dislocations and threading defects and the like in orientations parallel with the crystal growth direction. Because these defects are formed internally, they are not exposed on the outer surfaces parallel with the first growth direction. In other words, these defects are not revealed in the m-plane of the single crystal obtained when the <11-20> direction is selected as the first growth direction, and are not revealed in the a-plane of the single crystal obtained when the <1-100> direction is selected as the first growth direction. In the second growth step, crystal growth is performed on this surface having none of these defects. In other words, the second growth portion 12 obtained following the second growth step can be obtained as a high-quality single crystal having extremely few screw dislocations or threading dislocations.

<Third Growth Step>

In the third growth step, crystal growth is performed along the direction of crystal growth of the SiC single crystal in the first growth step but in the opposite orientation to the orientation of crystal growth in the first growth step. In FIG. 2 and FIG. 3, a third growth portion 13 is the portion formed by crystal growth in the third growth step. In FIG. 2, because crystal growth of the SiC single crystal was performed in the <11-20> direction in the first growth step, the direction of crystal growth of the single crystal in the third growth step is also the <11-20> direction. In contrast, in FIG. 3, because crystal growth of the SiC single crystal was performed in the <1-100> direction in the first growth step, the direction of crystal growth of the single crystal in the third growth step is also the <1-100> direction. However, in either case, the orientation of the crystal growth in the third growth step is of the opposite orientation to that of the crystal growth in the first growth step.

The third growth step can be performed using the same method as the first and second growth steps. During this step, the surface mounted on the seed crystal mount 16 is a surface composed of the first growth portion 11 and the second growth portion 12. This mounting surface is preferably planarized prior to mounting.

In the third growth step, the SiC single crystal grows in the opposite orientation to the direction of crystal growth in the first growth step. As a result, the orientation of the stress that acts upon the SiC single crystal in the first growth step and the orientation of the stress that acts upon the SiC single crystal in the third growth step have opposite directions. Consequently, the stresses cancel each other out, meaning the occurrence of strain in the SiC single crystal can be alleviated.

The amount of growth of the single crystal grown in the third growth step and the amount of growth of the single crystal grown in the first growth step are preferably substantially equal. More specifically, the amount of growth of the single crystal in the third growth step relative to the amount of growth of the single crystal in the first growth step is preferably within a range from 0.9 times to 1.1 times. The amount of growth of the single crystal means the length by which the single crystal grows in the crystal growth direction during each growth step. Provided that the amount of growth of the single crystal in the first growth step and the amount of growth of the single crystal in the third growth step are substantially equal, the stresses generated in the two steps cancel each other out. In other words, the stress acting on the SiC single crystal can be suppressed both during crystal growth and following crystal growth.

The direction of crystal growth in the third growth step differs by 90° from the direction of crystal growth in the second growth step. As a result, residual screw dislocations or threading dislocations in the second growth portion 12 are not revealed on one surface (the a-plane in FIG. 2, and the m-plane in FIG. 3) of the second growth portion 12 on which crystal growth starts in the third growth step. Accordingly, the possibility of screw dislocations or threading dislocations occurring beyond the second growth portion 12 and into the third growth portion 13 is lowered, resulting in a higher quality single crystal.

<Fourth Growth Step>

In the fourth growth step, crystal growth is performed along the direction of crystal growth of the SiC single crystal in the second growth step but in the opposite orientation to the orientation of crystal growth in the second growth step. In FIG. 2 and FIG. 3, a fourth growth portion 14 is the portion formed by crystal growth in the fourth growth step. In FIG. 2, because crystal growth of the SiC single crystal was performed in the <1-100> direction in the second growth step, the direction of crystal growth of the single crystal in the fourth growth step is also the <1-100> direction. In FIG. 3, because crystal growth of the SiC single crystal was performed in the <11-20> direction in the second growth step, the direction of crystal growth of the single crystal in the fourth growth step is also the <11-20> direction. However, in either case, the orientation of the crystal growth in the fourth growth step is the opposite orientation to that of the crystal growth in the second growth step.

The fourth growth step can be performed using the same method as the first through third growth steps. During this step, the surface mounted on the seed crystal mount 16 is a surface composed of the second growth portion 12 and the third growth portion 13. This mounting surface is preferably planarized prior to mounting.

In the fourth growth step, the SiC single crystal grows in the opposite orientation to the direction of crystal growth in the second growth step. As a result, the orientation of the stress that acts upon the SiC single crystal in the second growth step and the orientation of the stress that acts upon the SiC single crystal in the fourth growth step have opposite directions. Consequently, the stresses cancel each other out, meaning the occurrence of strain in the SiC single crystal can be alleviated.

The amount of growth of the single crystal grown in the fourth growth step and the amount of growth of the single crystal grown in the second growth step are preferably substantially equal. More specifically, the amount of growth of the single crystal in the fourth growth step relative to the amount of growth of the single crystal in the second growth step is preferably within a range from 0.9 times to 1.1 times. Provided that the amount of growth of the single crystal in the second growth step and the amount of growth of the single crystal in the fourth growth step are substantially equal, the stresses generated in the two steps cancel each other out. In other words, the stress acting on the SiC single crystal can be suppressed both during crystal growth and following crystal growth.

The direction of crystal growth in the fourth growth step differs by 90° from the direction of crystal growth in the third growth step. As a result, the possibility of screw dislocations or threading dislocations occurring beyond the third growth portion 13 and into the fourth growth portion 14 is lowered. In other words, by performing the first through fourth growth steps, the possibility of the occurrence of screw dislocations or threading dislocations is gradually suppressed, meaning a higher quality SiC single crystal can be obtained.

In this manner, by performing the first through fourth growth steps, the stress that occurs in the first growth step and the stress that occurs in the third growth step cancel each other out, and the stress that occurs in the second growth step and the stress that occurs in the fourth growth step cancel each other out. In other words, by performing the first through fourth growth steps, damage of the SiC single crystal due to stress or the like during the crystal growth process can be suppressed. Further, because the crystal growth direction is altered by 90° in each growth step, a higher quality SiC single crystal can be obtained.

In a method for growing a SiC single crystal according to one aspect of the present invention, these first through fourth growth steps are deemed to constitute a set, and this set is repeated a plurality of times. FIG. 2 and FIG. 3 show a portion 21 grown in a second repetition of the first growth step, a portion 22 grown in a second repetition of the second growth step, a portion 23 grown in a second repetition of the third growth step, and a portion 24 grown in a second repetition of the fourth growth step. By performing a plurality of repetitions of the set composed of the first through fourth growth steps, a large SiC single crystal 100 can be obtained from the seed crystal 10.

The above examples describe cases in which crystal growth of the crystal is performed once in each of the first through fourth steps. However, growth of the crystal may also be divided into a plurality of stages within each of the first through fourth steps. Compared with single crystals of silicon or the like, the crystal growth rate of SiC single crystals is extremely slow. Accordingly, crystal growth of the crystal generally proceeds gradually. Because the crystal growth proceeds gradually, the amount of stress acting on the crystal can be reduced. Further, if the amount of crystal growth in a single step is large, then the size of the equipment must be increased appropriately. Accordingly, dividing each of the first through fourth steps into a plurality of stages is also preferred from a cost perspective.

No crystal growth occurs in the <0001> direction in each of the growth steps. As a result, the SiC single crystal has little resistance to stress applied in the thickness direction and is easily damaged. The length of crystal growth from the seed crystal 10 in each orientation is preferably from 0.5 times to 5 times, and more preferably from 1 to 3 times, the thickness of the seed crystal 10. Here, the length of crystal growth in each orientation means the length of crystal growth from the seed crystal 10 in the two a-plane directions and the two m-plane directions. Provided the length of crystal growth satisfies this range, the obtained SiC single crystal has sufficient resistance to force applied in the thickness direction of the crystal, and the likelihood of problems such as the SiC single crystal breaking during the growth process can be better suppressed.

Crystal growth in the first through fourth growth steps is preferably performed so that the SiC single crystal obtained following each growth step has a length along the long direction that is not more than 10 times, and more preferably not more than 5 times, the length along the short direction. By ensuring that the length along the long direction relative to the length along the short direction of the SiC single crystal falls within this range, an excessive moment can be prevented from acting in the long direction. In other words, damage of the SiC single crystal during the growth process can be better suppressed.

By using the method for producing a SiC single crystal of the first embodiment of the present invention, a large SiC single crystal can be obtained while stress that is generated during the crystal growth process is alleviated. As a result, damage to the SiC single crystal due to stress or the like that occurs during the growth process can be suppressed. Further, because the direction of crystal growth is altered by 90° in each growth step, a SiC single crystal of superior quality can be obtained.

Second Embodiment

Figure 5:
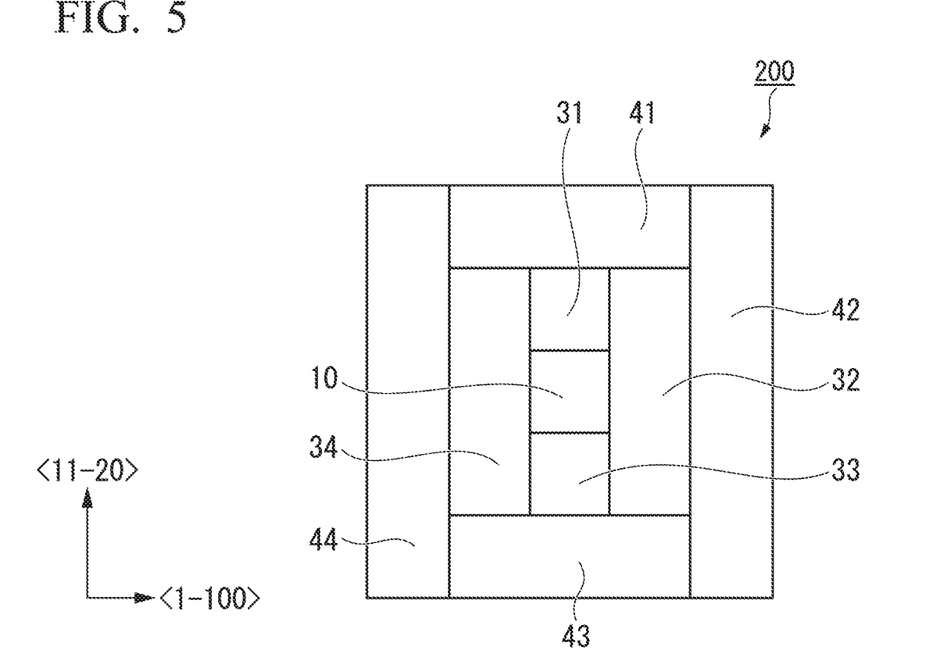
FIG. 5 is schematic plan view for describing the production steps of a method for producing a SiC single crystal of a second embodiment.

FIG. 5 is schematic plan view for describing the production steps of a method for producing a SiC single crystal of a second embodiment. FIG. 5 is a schematic plan view of the SiC single crystal viewed from the c-plane side of the SiC single crystal. The method for producing a SiC single crystal according to the second embodiment differs from the method for producing a SiC single crystal according to the first embodiment in terms of the sequence in which the first through fourth growth steps are performed. Other points are the same as the method for producing a SiC single crystal of the first embodiment. Descriptions of portions that are the same are omitted.

In the method for producing a SiC single crystal of the second embodiment, crystal growth is performed in a sequence composed of the first growth step, the third growth step, the second growth step, and then the fourth growth step. In other words, in FIG. 5, crystal growth is performed in a sequence that yields a first growth portion 31, a third growth portion 33, a second growth portion 32, and then a fourth growth portion 34.

By continuing crystal growth with these growth steps deemed to constitute one set, a portion 41 grown in a second repetition of the first growth step, a portion 43 grown in a second repetition of the third growth step, a portion 42 grown in a second repetition of the second growth step, and then a portion 44 grown in a second repetition of the fourth growth step are then grown in that order.

The stress generated in the first growth step is canceled out by the stress generated in the third growth step. Further, the stress generated in the second growth step is canceled out by the stress generated in the fourth growth step. In other words, by performing crystal growth in this sequence, crystal growth can proceed with any generated stress reduced to a minimum. Accordingly, damage to the SiC single crystal during the crystal growth process can be better suppressed.

In the method for producing a SiC single crystal according to the second embodiment, the first growth portion 31 and the third growth portion 33 are first grown from the seed crystal 10. As a result, screw dislocations and threading dislocations occur in the first growth portion 31 and the third growth portion 33. Subsequently, the crystal growth direction is altered by 90°, and the second growth portion 32 and the fourth growth portion 34 are formed. Therefore, as described above in relation to the method for producing a SiC single crystal of the first embodiment, the possibility of screw dislocations and threading dislocations occurring in the second growth portion 32 and the fourth growth portion 34 is lowered. Accordingly, a SiC single crystal 200 obtained by repeating these steps becomes a high-quality crystal with few crystal defects.

In the method for producing a SiC single crystal of the second embodiment, the length along the long direction relative to the short direction for the SiC single crystal obtained following the first growth step and the third growth step is more likely to increase. Accordingly, there is a possibility of an excessive moment acting in the long direction. That is, it is preferable that the amount of crystal growth in the second growth step and the fourth growth step is larger than the amount of crystal growth in the first growth step and the third growth step.

By using the method for producing a SiC single crystal of the second embodiment of the present invention, a large SiC single crystal can be obtained while stress that is generated during the crystal growth process is alleviated. As a result, damage to the SiC single crystal due to stress or the like that occurs during the growth process can be suppressed. Further, because the method has growth steps in which the direction of crystal growth varies by 90°, a SiC single crystal of superior quality can be obtained.

Third Embodiment

Figure 6:
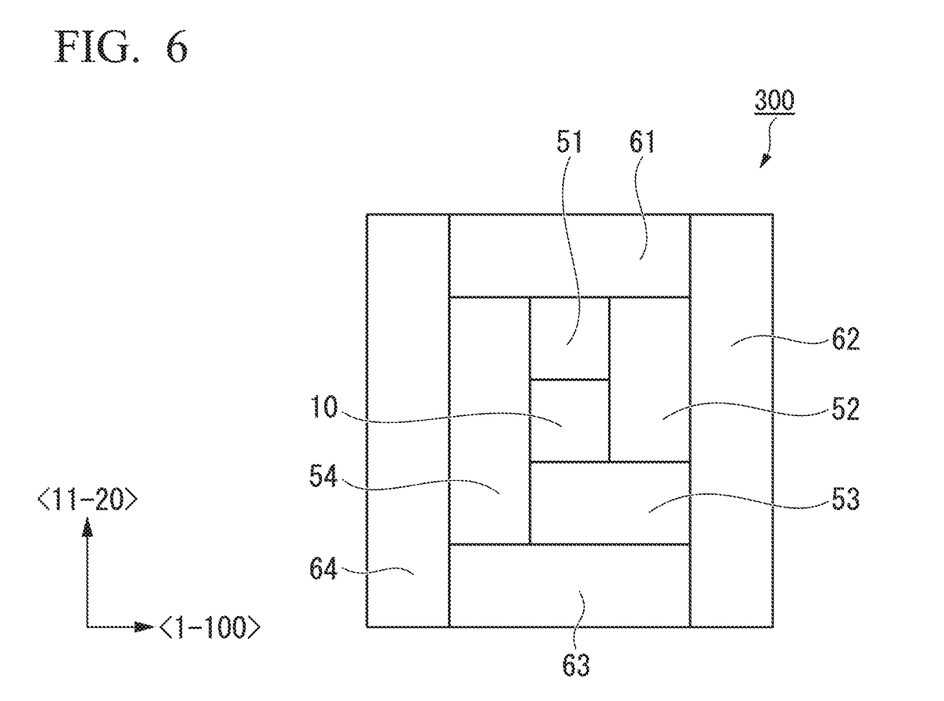
FIG. 6 is schematic plan view for describing the production steps of a method for producing a SiC single crystal of a third embodiment.

FIG. 6 is schematic plan view for describing the production steps of a method for producing a SiC single crystal of a third embodiment. FIG. 6 is a schematic plan view of the SiC single crystal viewed from the c-plane side of the SiC single crystal. The method for producing a SiC single crystal according to the third embodiment differs from the first embodiment and the second embodiment in that when the set composed of the first through fourth growth steps is repeated a plurality of times, the sequence of the first through fourth growth steps is altered for each set. Other points are the same as the method for producing a SiC single crystal of the first embodiment. Descriptions of portions that are the same are omitted.

In the method for producing a SiC single crystal according to the third embodiment, in the first set composed of the first through fourth growth steps, crystal growth is performed in a sequence composed of the first growth step, the second growth step, the third growth step, and then the fourth growth step. In other words, in FIG. 6, crystal growth is performed in a sequence that yields a first growth portion 51, a second growth portion 52, a third growth portion 53, and then a fourth growth portion 54. In contrast, in the second set, crystal growth is performed in a sequence composed of the first growth step, the third growth step, the second growth step, and then the fourth growth step. In other words, a portion 61 grown in a second repetition of the first growth step, a portion 63 grown in a second repetition of the third growth step, a portion 62 grown in a second repetition of the second growth step, and then a portion 64 grown in a second repetition of the fourth growth step are grown in that order.

The method for producing a SiC single crystal according to the third embodiment is a combination of the method for producing a SiC single crystal of the first embodiment and the method for producing a SiC single crystal of the second embodiment.

Accordingly, in a similar manner to the method for producing a SiC single crystal of the first embodiment and the method for producing a SiC single crystal of the second embodiment, damage to the SiC single crystal due to stress or the like that occurs during the growth process can be suppressed. Further, because the method has growth steps in which the direction of crystal growth varies by 90°, a SiC single crystal of superior quality can be obtained.

OTHER EMBODIMENTS

In the first through third embodiments described above, the combination of the first growth step, the second growth step, the third growth step and the fourth growth step is deemed to represent one set, and crystal growth is performed by performing a plurality of repetitions of this set. However, the crystal growth need not necessarily include each of the steps in one set, and the set need not necessarily be repeated a plurality of times. Each growth step may be performed randomly. For example, the method may have a crystal growth process with a sequence composed of the first growth step, the second growth step, the first growth step, the third growth step, and then the fourth growth step. In this manner, even if the first through fourth growth steps do not form a single set, by performing crystal growth from the seed crystal in four directions, the stress that is generated in each direction can be reduced.

In those cases where the growth steps are not grouped into a set, and crystal growth is performed in a random sequence, it is preferable that the amount of crystal growth from the seed crystal in each growth direction is substantially equal by the time the SiC single crystal is obtained. In other words, it is preferable to avoid cases in which one growth step is much more frequent than the other growth steps. Provided the amount of crystal growth in each direction is substantially equal, the stress that occurs in each direction can be relatively alleviated, and damage during the growth process can be avoided.

Further, even in cases where the combination of the first growth step, the second growth step, the third growth step and the fourth growth step is deemed to represent one set, and the growth process includes a plurality of those sets, a growth step in a required direction may be arbitrarily inserted between sets in order to adjust the amount of crystal growth in that direction. By adjusting any fluctuations in the amount of crystal growth between growth steps, and ensuring that the amount of crystal growth from the seed crystal in each crystal growth direction is substantially equal, the stress that is generated in each direction can be relatively alleviated, and damage during the growth process can be avoided.

(SiC Single Crystal and SiC Ingot)

A SiC single crystal according to one aspect of the present invention is formed using the method described above. Accordingly, crystal growth portions are formed on all four side surfaces of the seed crystal. In the SiC single crystal, the boundary of each growth portion can be confirmed by the amount of defects. Because the boundary of each growth portion is also subjected to processing such as polishing, the amount of defects tends to be larger than the portion of crystal growth. Accordingly, based on the relative amounts of defects, a determination can be made as to whether or not the single crystal has crystal growth portions in four directions relative to the seed crystal.

Further, as described above, the SiC single crystal according to one aspect of the present invention is prepared using the procedure described above. As a result, the SiC single crystal according to one aspect of the present invention has extremely few defects such as screw dislocations and threading dislocations. Further, because the SiC single crystal has crystal growth portions (the first through fourth growth portions) in four directions relative to the seed crystal, there is little crystal strain. In other words, the SiC single crystal according to one aspect of the present invention can be used favorably in semiconductor devices and the like.

Further, the SiC ingot uses this SiC single crystal, and has a c-axis growth portion grown in the c-axis direction. The growth direction of the c-axis growth direction is a direction that is orthogonal to all of the growth directions in the first through fourth growth steps described above. Accordingly, defects such as screw dislocations and threading dislocations can be better reduced. As a result, a SiC ingot according to one aspect of the present invention enables SiC single crystal wafers of super quality to be obtained.

Preferred embodiments of the present invention have been described above in detail, but the present invention is not limited to these specific embodiments, and various modifications and alterations are possible without departing from the scope of the present invention disclosed within the claims.

DESCRIPTION OF THE REFERENCE SIGNS

10: Seed crystal
11 31, 51: First growth portion
12, 32, 52: Second growth portion
13, 33, 53: Third growth portion
14, 34, 54: Fourth growth portion
21, 41, 61: Portion grown in second repetition of the first growth step
22, 42, 62: Portion grown in second repetition of the second growth step
23, 43, 63: Portion grown in second repetition of the third growth step
24, 44, 64: Portion grown in second repetition of the fourth growth step

The invention claimed is:

1. A method for producing a SiC single crystal, comprising:
   a first growth step of growing a crystal from a seed crystal in a <1-100> direction or a <11-20> direction;
   a second growth step of growing the crystal in a direction among the <1-100> direction and the <11-20> direction in which crystal growth was not performed in the first growth step;
   a third growth step of growing the crystal along the direction of crystal growth in the first growth step but in an opposite orientation to an orientation of crystal growth in the first growth step; and
   a fourth growth step of growing the crystal along the direction of crystal growth in the second growth step but in an opposite orientation to an orientation of crystal growth in the second growth step, wherein an amount of growth of the single crystal in the third growth step relative to an amount of growth of the single crystal in the first growth step is within a range from 0.9 times to 1.1 times.

2. The method for producing a SiC single crystal according to claim 1, wherein each of the first growth step, the second growth step, the third growth step and the fourth growth step is divided into a plurality of stages.

3. The method for producing a SiC single crystal according to claim 1, wherein the first growth step, the second growth step, the third growth step and the fourth growth step represent one set, and the set is performed at least once.

4. The method for producing a SiC single crystal according to claim 3, wherein in the set of growth steps, the growth steps are performed in a sequence composed of the first growth step, the second growth step, the third growth step, and then the fourth growth step.

5. The method for producing a SiC single crystal according to claim 3, wherein in the set of growth steps, the growth steps are performed in a sequence composed of the first growth step, the third growth step, the second growth step, and then the fourth growth step.

6. The method for producing a SiC single crystal according to claim 1, wherein an amount of growth of the single crystal in the fourth growth step relative to an amount of growth of the single crystal in the second growth step is within a range from 0.9 times to 1.1 times.

7. The method for producing a SiC single crystal according to claim 1, wherein a length of crystal growth from the seed crystal in each orientation is from 0.5 times to 5 times a thickness of the seed crystal.

8. The method for producing a SiC single crystal according to claim 1, wherein in each of the first growth step, the second growth step, the third growth step and the fourth growth step, the SiC single crystal obtained following each growth step has a length along a long direction that is not more than 10 times a length along a short direction.

* * * * *